(12) United States Patent
Schauwecker et al.

(10) Patent No.: US 9,958,520 B2
(45) Date of Patent: May 1, 2018

(54) INTRODUCING AN NMR APPARATUS COMPRISING COOLED PROBE COMPONENTS VIA A VACUUM LOCK

(71) Applicant: Bruker BioSpin AG, Faellanden (CH)

(72) Inventors: Robert Schauwecker, Zurich (CH); Joerg Hinderer, Waldshut-Tiengen (DE)

(73) Assignee: Bruker BioSpin AG, Faellanden (CH)

( * ) Notice: Subject to any disclaimer, the term of this patent is extended or adjusted under 35 U.S.C. 154(b) by 0 days. days.

(21) Appl. No.: 15/673,063

(22) Filed: Aug. 9, 2017

(65) Prior Publication Data

US 2018/0045796 A1    Feb. 15, 2018

(30) Foreign Application Priority Data

Aug. 9, 2016    (DE) .................. 10 2016 214 728

(51) Int. Cl.
 *G01R 33/38*    (2006.01)
 *G01R 33/34*    (2006.01)
 *G01R 33/3815*    (2006.01)

(52) U.S. Cl.
 CPC ..... *G01R 33/3804* (2013.01); *G01R 33/3403* (2013.01); *G01R 33/34023* (2013.01); *G01R 33/3815* (2013.01); *G01R 33/34015* (2013.01)

(58) Field of Classification Search
 CPC ............ G01R 33/3815; G01R 33/3804; G01R 33/34023; G01R 33/3403; G01R 33/34015; G01R 33/34092; G01R 33/46
 See application file for complete search history.

(56) References Cited

U.S. PATENT DOCUMENTS

| | | |
|---|---|---|
| 5,934,082 A | 8/1999 | Steinmeyer |
| 2005/0122107 A1 | 6/2005 | Hasegawa et al. |

(Continued)

FOREIGN PATENT DOCUMENTS

| | | |
|---|---|---|
| DE | 19533555 A1 | 3/1997 |
| DE | 102005029151 A1 | 12/2006 |

(Continued)

OTHER PUBLICATIONS

Office Action in corresponding German Application 102016214728.5, dated Aug. 9, 2016, along with English Translation.

(Continued)

*Primary Examiner* — Rishi Patel
(74) *Attorney, Agent, or Firm* — Edell, Shapiro & Finnan, LLC

(57) ABSTRACT

An NMR apparatus includes a superconducting magnet assembly, a cryostat having a vacuum vessel, a refrigeration stage that can be operated at a temperature of <100 K, and a magnet coil system that comprises a cold bore into which a room temperature access of the cryostat engages. The NMR apparatus also includes an NMR probe with probe components cooled to an operating temperature of <100 K. The probe components are arranged between the cold bore and the room temperature access into the cold bore, radially inside the cold bore but outside the room temperature access. The vacuum vessel includes an opening that can be closed by a lock valve. A lock chamber is directly connected to the opening, such that the cooled probe components can be installed and/or removed through the opening and lock valve without breaking the vacuum in the vacuum vessel of the cryostat.

16 Claims, 9 Drawing Sheets

(56) References Cited

U.S. PATENT DOCUMENTS

| | | |
|---|---|---|
| 2005/0202976 A1 | 9/2005 | Killoran |
| 2006/0130493 A1 | 6/2006 | Strobel |
| 2007/0089432 A1 | 4/2007 | Boesel et al. |
| 2007/0107445 A1 | 5/2007 | Boesel et al. |
| 2012/0242335 A1 | 9/2012 | Schett et al. |
| 2012/0242336 A1 | 9/2012 | Stauffenegger et al. |
| 2012/0319690 A1 | 12/2012 | Ma et al. |
| 2013/0063148 A1 | 3/2013 | Ma et al. |
| 2014/0125340 A1 | 5/2014 | Hunkeler et al. |
| 2015/0168518 A1* | 6/2015 | Hirose ............ G01R 33/34007 324/318 |
| 2016/0091142 A1* | 3/2016 | Wikus ................ G01R 33/3804 324/309 |
| 2016/0231397 A1* | 8/2016 | Mizuno .................. G01R 33/30 |

FOREIGN PATENT DOCUMENTS

| | | |
|---|---|---|
| DE | 102013201110 B3 | 4/2014 |
| EP | 1435525 | 7/2004 |
| GB | 2489566 A | 10/2012 |
| JP | H07-120543 A | 5/1995 |

OTHER PUBLICATIONS

European Search Report and Written Opinion in counterpart International Application No. EP17185260, dated Dec. 4, 2017, 9 pages.

\* cited by examiner

INTRODUCING AN NMR APPARATUS COMPRISING COOLED PROBE COMPONENTS VIA A VACUUM LOCK

CROSS REFERENCE TO RELATED APPLICATIONS

This application claims foreign priority under 35 U.S.C. § 119(a)-(d) to German Application No. 10 2016 214 728.5 filed on Aug. 9, 2016, the entire contents of which are hereby incorporated into the present application by reference

FIELD OF THE INVENTION

The present invention relates to a cryogenic system for cooling a superconducting magnet coil system and for cooling components of a nuclear magnetic resonance (NMR) probe, for example for use in magnetic resonance spectroscopy or magnetic resonance imaging (MRI). The applicability of the invention is not restricted to this field.

BACKGROUND

The invention relates to an NMR apparatus comprising a superconducting magnet assembly including a cryostat which has a vacuum vessel and a refrigeration stage that can be operated at an operating temperature of <100 K. The superconducting magnet assembly also includes a superconducting magnet coil system that comprises a cold bore into which a room temperature access of the cryostat engages. The NMR apparatus also includes an NMR probe being provided during operation that comprises probe components cooled to an operating temperature of <100 K. The invention also relates to a method for installing and removing the cooled probe components in/from the vacuum vessel of a cryostat of a superconducting magnet assembly of an NMR apparatus.

Superconducting magnet coil systems are operated in a cryostat in order to keep the temperature below the transition temperature of the superconductor. Typically, the cryostat has a vacuum vessel, in which one or more cryogenic vessels each containing a coolant, for example liquid helium or liquid nitrogen, are arranged. The superconducting magnet coil system is installed in the coldest cryogenic vessel. This results in the superconducting magnet coil system being cooled in a highly temperature stable and uniform manner. For example, NMR spectrometers are typically cooled in such a bath. In these systems, the vessels have to be refilled with the coolants at regular intervals because the heat input to the cryogenic vessels ensures that the coolants evaporate continuously. Alternatively, the coolants can be recondensed by a cryocooler on the cryostat, or cooling may be achieved by thermally attaching the superconducting magnet coil system and/or one or more radiation shields of the cryostat to a refrigeration stage of a cryocooler.

In order to install an NMR probe, the vacuum vessel of the cryostat is typically provided with a room temperature access into the cold bore of the superconducting magnet coil system. Given that operating the NMR probe at room temperature is detrimental to signal quality, probes comprising cooled components are used. Various designs of cryogenic probes of this kind are known. Usually, cryogenic probes are attached to the room temperature access of the cryostat so as to be removable, the cooled components in this case being arranged in a separate insulation vessel and being cooled by a cooling circuit. Cryogenic probes that are fixedly mounted at least in part in the insulation vacuum of the cryostat are, however, also known.

Various cryogenic systems for cooling a superconducting magnet coil system and for cooling components of an NMR probe are known, which differ in particular with respect to the mechanical integration of the magnet assembly and probe into a functional unit and with respect to the common use of components of the cryogenic system for cooling the magnet coil system and the probe.

Some U.S. Pre-Grant publications (US 2012/0242335 A1, US 2007/0107445 A1, US 2005/0202976 A1, US 2006/0130493 A1 and US 2013/063148 A1) generally describe assemblies comprising a cryogenic probe that is attached to the room temperature access of the cryostat of the magnet assembly so as to be removable.

In US 2012/0242335 A1 the cryogenic probe is cooled by means of a cooling circuit which is thermally connected to a refrigeration reservoir of the cryostat of the magnet assembly, for example to a liquid nitrogen vessel.

In US 2007/0107445 A1, US 2005/0202976 A1, US 2006/0130493 A1 and US 2013/063148 A1, the cryogenic probe and parts of the cryostat of the magnet assembly are cooled by means of a common cryocooler.

These assemblies are disadvantageous in that significant expense for the cooling circuit of the probe is required. Additionally, cooling capacity losses result from the complexity of the instruments of the cooling circuit. Furthermore, the cooled probe components have to be arranged in a separate insulation vacuum, which is detrimental to the compactness of the superconducting magnet coil system as a result of the increased amount of space required by the cryogenic probe in the room temperature access of the cryostat of the magnet assembly.

An assembly according to US 2012/0319690 A1 comprises a cryogenic probe that is installed in the vacuum vessel of the cryostat of the superconducting magnet assembly. This assembly is disadvantageous, however, in that the magnet assembly and cryogenic probe are no longer mechanically modular. In order to replace the cryogenic probe, for example when there is a fault or in order to carry out NMR measurements that place different requirements on the functional scope of the cryogenic probe, the cryostat vacuum has to be broken. Changing the probe therefore requires that the superconducting magnet coil system be discharged and the magnet assembly be warmed-up.

SUMMARY

An object of the present invention is to improve an NMR apparatus of the type described at the outset comprising a superconducting magnet coil system in a cryostat. The NMR apparatus comprises a cryogenic probe, the cooled components of which are arranged inside the vacuum vessel of the cryostat during operation, such that the cooled probe components can be moved into and out of the vacuum vessel without breaking the insulation vacuum in the vacuum vessel of the cryostat.

This object is achieved, according to one formulation of the invention, using cooled probe components that are arranged, at least in part, in a region between the cold bore in the superconducting magnet coil system and the room temperature access of the cryostat into the cold bore. The cooled components are arranged radially inside the cold bore but outside the room temperature access of the cryostat. The vacuum vessel of the cryostat comprises an opening that can be closed with a lock valve, and a lock chamber which is directly connected to the opening or a device for attaching a lock chamber to the opening such that the lock chamber and opening are directly connected. The opening and the lock valve are of such a size and are arranged such that the cooled probe components can be installed and/or removed through the opening and lock valve.

The present invention thus proposes an NMR apparatus which makes it possible to install/remove the cooled components of a cryogenic probe into/from the vacuum vessel of the cryostat of a superconducting magnet assembly through a lock mechanism under a vacuum. Therefore, the magnet assembly does not have to be warmed up for this process and may remain in the charged state.

This assembly combines the advantages of a cryogenic probe that is arranged at least in part inside the vacuum vessel of the cryostat, namely that the structure is simple and space-saving without a separate insulation vessel for the cooled probe components, and the advantages of a cryogenic probe that is arranged inside the room temperature access of the cryostat, in particular that it is easy to install and remove the cryogenic probe if there is a fault or when different types of cryogenic probes are being used for different NMR applications. Additional functional units of the probe, such as an NMR sample rotor, may be placed inside the room temperature access.

Some examples of the invention include a high frequency (HF) coil arranged in a region between the cold bore of the superconducting magnet coil system and the room temperature access of the cryostat into the cold bore. The space-saving installation of cooled HF coils in the vacuum vessel of the cryostat without a separate insulation vessel is particularly advantageous for the compact structure of the superconducting magnet coil system, since the HF coils are arranged directly around the NMR sample within the working space of the magnet assembly.

In other examples, the NMR apparatus may include a mechanically releasable thermal contact between the cooled probe components and a refrigeration stage of the cryostat. When cooling is carried out via thermal attachment to a refrigeration stage of the cryostat, a separate cooling device is not required for the cryogenic probe, and this is a particularly cost-effective and thermally efficient solution.

Additional examples include the cryostat comprising a refrigeration stage with a nitrogen vessel. The cooled probe components are coupled through a releasable thermal contact to the refrigeration stage of the cryostat comprising the nitrogen vessel. These further examples utilize the high cooling capacity brought about by the evaporation of liquid nitrogen and the thermal stability of the liquid nitrogen bath, and have been found to be a particularly cost-effective solution.

Further examples of the NMR apparatus are characterized in that the cryostat comprises a refrigeration stage with a radiation shield that is cooled by a single-stage cryocooler. The cooled probe components are coupled through a releasable thermal contact to the refrigeration stage of the cryostat that comprises the radiation shield cooled by a single-stage cryocooler. An advantage of a cryostat of a superconducting magnet assembly comprising a radiation shield that is cooled in this manner, as an alternative to a nitrogen vessel, is that the operating temperature of the radiation shield is lower than that of a vessel cooled by the evaporation of nitrogen. As a result, the cooled probe components can also be operated at a lower temperature. Furthermore, it is no longer necessary to periodically supply nitrogen.

Further, alternative examples of the NMR apparatus are characterized in that the cryostat comprises a refrigeration stage with a radiation shield that is cooled by the first stage of a two-stage cryocooler. The cooled probe components are coupled through a releasable thermal contact to the refrigeration stage of the cryostat that comprises the radiation shield cooled by the first stage of a two-stage cryocooler. An advantage of a cryostat of a superconducting magnet assembly comprising a radiation shield that is cooled in this manner, as an alternative to a radiation shield that is cooled by a single-stage cryocooler, is that a superconducting magnet coil system, in particular having low-temperature superconductors, can be cooled by thermal attachment to the second (colder) stage of the cryocooler. Additionally, helium gas from a helium vessel of the cryostat can be condensed on the second stage of the cryocooler.

Further alternative examples of the NMR apparatus are characterized in that the cryostat comprises a refrigeration stage with a superconducting magnet coil system that is cooled by a single-stage cryocooler. The cooled probe components are coupled through a releasable thermal contact to the refrigeration stage of the cryostat that comprises the superconducting magnet coil system cooled by a single-stage cryocooler. These alternative examples are advantageous in particular for cryogen-free superconducting magnet assemblies that include a superconducting magnet coil system with high-temperature superconductors. A magnet coil system of this kind can be cooled to temperatures which are sufficiently low for efficient operation by thermal attachment to a single-stage cryocooler.

Another example of the NMR apparatus is characterized in that the mechanically releasable thermal contact comprises thermal contact elements which are formed on either side of the mechanically releasable thermal contact as a cone and an interlocking mating cone. The cone and mating cone may be produced from a heat-conductive material having a heat conductivity at the operating temperature of the assembly of greater than 20 W/(K*m), in particular copper. The cone and mating cone may also be coated with a noble metal, in particular gold. The cone and mating cone may be pressed against one another in the operating state by a spring element with a force of at least 20 N. This results in optimum heat transfer between the cooled probe components and a refrigeration stage of the cryostat.

In some examples of the NMR apparatus, the cooled probe components may be cooled from outside the cryostat using an external cooling circuit. This significantly simplifies the mechanics, because the cooled probe components do not need to be thermally attached to a refrigeration stage of the cryostat. Furthermore, the thermal equilibrium of the refrigeration stages of the cryostat, in particular the refrigeration stage cooling the superconducting magnet coil system, is not disrupted as a result of thermal loads by the cooled probe components. The required cooling capacity can be adapted to the heat input of the probe, independently of the cooling of the cryostat. This example is particularly advantageous when the probe has a high thermal output.

The cooled probe components of the NMR apparatus according may include normally conducting and/or superconducting components. Normally conducting components are cost-effective and have lower requirements in terms of cooling. In contrast, superconducting components produce better signal quality.

In one example, a mechanically releasable thermal contact is provided between the cooled probe components and a refrigeration stage of the cryostat. The cooled probe components can be cooled from outside the cryostat using an external cooling circuit, with the probe-side thermal contact element being colder than the thermal contact element of the refrigeration stage of the cryostat in the operating state of the assembly. This assembly makes it possible to utilize the cooling capacity of a cooling circuit comprising a high-performance cryocooler arranged outside the cryostat not only to cool the probe components, but also to absorb heat from a refrigeration stage of the cryostat, for example, from a radiation shield arranged around a cryogenic vessel. This can, for example, reduce the evaporation rate of cryogenic liquids from a cryogenic vessel of the cryostat assembly.

In other examples of the NMR apparatus, the NMR probe is designed such that, in the installed state, part of the NMR probe can close the open lock valve in the opening of the vacuum vessel in an air-tight manner. This enables the lock chamber to be detached in the operating state. A detachable lock chamber enables improved protection against loss of vacuum and access to the warm end of the installed NMR probe for contacting electrical connections or cooling lines.

In further examples, a lift mechanism is provided in the lock chamber for raising and lowering the cooled probe components out of/into the vacuum vessel. This allows the probe to be raised and/or lowered in a controlled and precise manner.

Examples of the NMR apparatus may include low-temperature superconductors (LTS) or high-temperature superconductors (HTS). In order to cool magnet coil systems comprising LTS to the required low operating temperatures of a few Kelvin, cryostat assemblies may include a plurality of cascade-connected refrigeration stages, which offer particularly diverse options for thermally attaching cooled probe components. Magnet coil systems comprising HTS can be operated at similar temperatures to cooled probe components, which renders thermal and mechanical integration of these two components of an NMR apparatus particularly advantageous.

In another example, the magnet assembly may include a shim system, such as an active shim system comprising shim coils or a passive shim system comprising one or more ferromagnetic field-shaping elements, inside the cryostat in order to homogenize the magnetic field. The shim system may be arranged between the cold bore of the superconducting magnet coil system and the cooled probe components. The shim system may also be thermally attached to a refrigeration stage of the cryostat or to an external cooling circuit. Arranging the shim system inside the cold bore of the superconducting magnet coil system (i.e., near the NMR sample) produces a highly efficient shim system, but the efficiency of the HF coils is not impaired by the shim system being arranged radially outside the cooled probe components. Cooling the shim system prevents undesirably high thermal gradients between the superconducting magnet coil system, shim system and cooled probe components.

A method for installing/removing cooled probe components in/from the vacuum vessel of a cryostat of a superconducting magnet assembly of an NMR apparatus according to the invention is also covered by the present invention and may be characterized by the following steps:

1. decoupling connection lines of the NMR probe to other parts of the NMR apparatus;
2. attaching a lock chamber to the lock valve;
3. evacuating the lock chamber;
4. moving the probe components to be removed out of the vacuum vessel of the cryostat and into the lock chamber;
5. closing the lock valve;
6. flooding and opening the lock chamber, and taking out the probe components to be removed;
7. introducing the probe components to be installed into the lock chamber, and closing and evacuating the lock chamber;
8. opening the lock valve;
9. moving the probe components to be installed out of the lock chamber and into the vacuum vessel of the cryostat;
10. flooding and removing the lock chamber; and
11. coupling the connections of an external cooling circuit to the NMR probe.

This method enables the cooled probe components to be interchanged without breaking the cryostat vacuum, and without warming up the magnet assembly.

BRIEF DESCRIPTION OF THE DRAWINGS

The invention is illustrated in the drawings and is explained in greater detail with reference to the embodiments. In the drawings.

DETAILED DESCRIPTION

Figure 1:
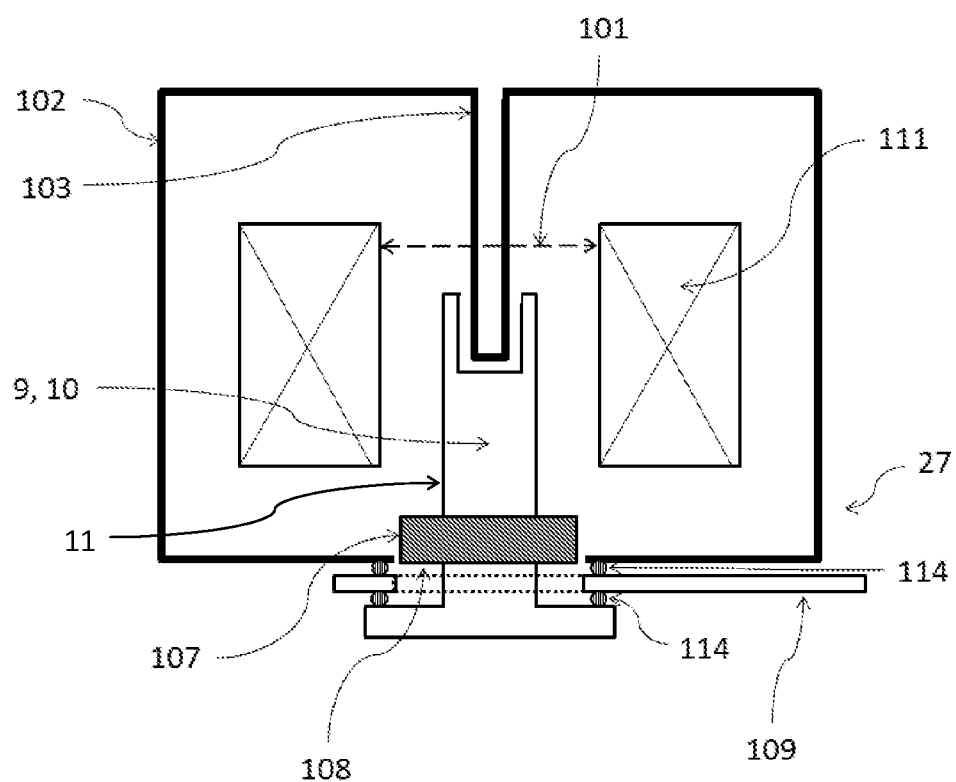
FIG. 1 is a schematic view of a first example embodiment of the NMR apparatus according to the invention in the operating state, when the lock chamber is detached.

FIG. 1 is a schematic view of a first embodiment of the NMR apparatus according to the invention in the operating state, when the lock chamber is detached.

Figure 2:
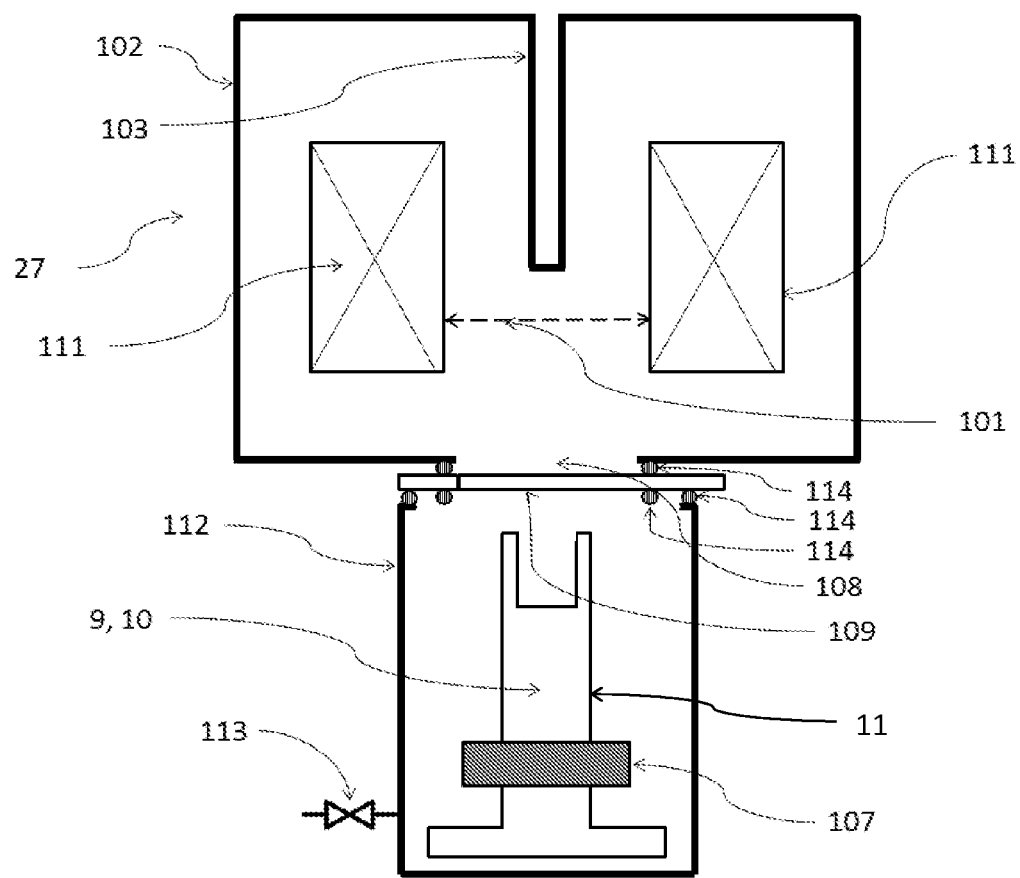
FIG. 2 shows an example embodiment of the NMR apparatus having a lock chamber coupled thereto via a lock valve.

FIG. 2 shows the same embodiment as FIG. 1, in which a lock chamber 112 is coupled to the vacuum chamber 102 of the cryostat from below via a lock valve 109 in order to introduce the NMR probe 11 into the cold bore 101 of the cryostat.

FIG. 1 and FIG. 2 illustrate two states of the NMR apparatus according to the invention achieved during installation/removal of probe components in/from the vacuum vessel of the cryostat. In this case, FIG. 1 corresponds to the state before decoupling connection lines of the NMR probe 11 to other parts of the NMR apparatus, or after coupling the connections of an external cooling circuit to the NMR probe 11. FIG. 2 corresponds to the state between closing the lock valve 109 and flooding and opening the lock chamber 112, and taking out the removed probe components 9, 10. In the operating state (e.g., FIG. 1), the NMR probe 11 is connected to other parts of the NMR apparatus via electrical and optionally fluid lines (see, for example, FIG. 9). These lines are decoupled from the NMR probe 11 in a first step of a method for removing the NMR probe. This then makes it possible for the lock chamber 112 to be attached in a vacuum-tight manner to the vacuum vessel 102 of the cryostat via the sealing rings 114. After the lock chamber 112 has been evacuated by the pump-out valve 113, the lock valve 109 can be opened, and the NMR probe 11 is brought out of the operating position and into the removal position by a mechanical guide, either by an internal structure (e.g. electrically operated lift) or by a shaft guided through the lock chamber 112. In the removal position, the entire NMR probe 11 is below the plane of the lock valve 109, and the lock valve 109 can be closed, resulting in the state illustrated in FIG. 2. The NMR probe 11 is warmed-up from the operating temperature of the magnet to close to room temperature, preferably in the lock chamber 112. Otherwise ice and/or condensed water may accumulate on the NMR probe 11, which could damage the NMR probe 11. In addition, rapid changes in temperature also lead to large internal mechanical stress, which can damage the NMR probe 11.

Warming up the NMR probe 11 takes place primarily by heat radiation in the evacuated state of the lock chamber 112. However, a small amount (e.g., 1 mbar) of helium gas can be transferred into the lock chamber in order to thermally couple the NMR probe 11 to the lock chamber 112 by weak convective heat transfer. Alternatively, an electrical heating structure on the NMR probe 11 may heat up the NMR probe 11 in a controlled and gentle manner. Once the NMR probe 11 has been heated to room temperature, the lock chamber 112 is flooded. Then, the lock chamber 112 is detached together with the NMR probe 11 by releasing the vacuum-tight connection (e.g., sealing rings 114). The NMR probe 11 can then be removed from the lock chamber 112, and a second NMR probe 11 may be inserted into the lock chamber 112. Once the lock chamber 112 has been evacuated, the lock valve 109 is opened, and the second NMR probe 11 may be introduced into the superconducting magnet assembly 27 slowly enough for the second NMR probe 11 to be cooled slowly but continuously (e.g., by radiation), such that the thermal shock when being coupled to the refrigeration stages of the cryostat is minimized.

Once the second NMR probe 11 has been mechanically coupled to the superconducting magnet assembly 27 and the second NMR probe 11 has been secured in the operating position, the connection of the second NMR probe 11 to the vacuum vessel 102 of the cryostat is vacuum tight with respect to the atmosphere, and the lock chamber 112 can be flooded using the pump-out valve 113 and removed.

Finally, the electrical and (optionally) fluid lines of the second NMR probe 11 to the NMR apparatus are reconnected to the second NMR probe 11. This concludes the method for removing a first NMR probe 11 and installing a second NMR probe 11.

FIGS. 3 to 8 show the shim system 104 in the cold bore 101 of the superconducting magnet coil system 111. This shim system 104 can include passive elements (e.g., iron shims) which influence the field as a result of their magnetic susceptibility, in that the geometric distribution is used to correct field inhomogeneity. These passive shims are attached to a mechanical support structure. In this respect, a metal tube, for example, may form part of a radiation shield 21 or 110, and can be in thermal and mechanical contact therewith. The shim system 104 can however also be constructed from active components. In this case, the shim system 104 comprises conductor loops through which current passes and which are typically made of a good electrical conductor, such as copper or even superconductor material. In both cases, coupling to a refrigeration stage of the cryostat is advantageous or, in the case of superconductors, typically required. In this case too, the shim system 104 may be mounted on a support tube which is, for example, thermally connected to a radiation shield 21 or 110.

Figure 3:
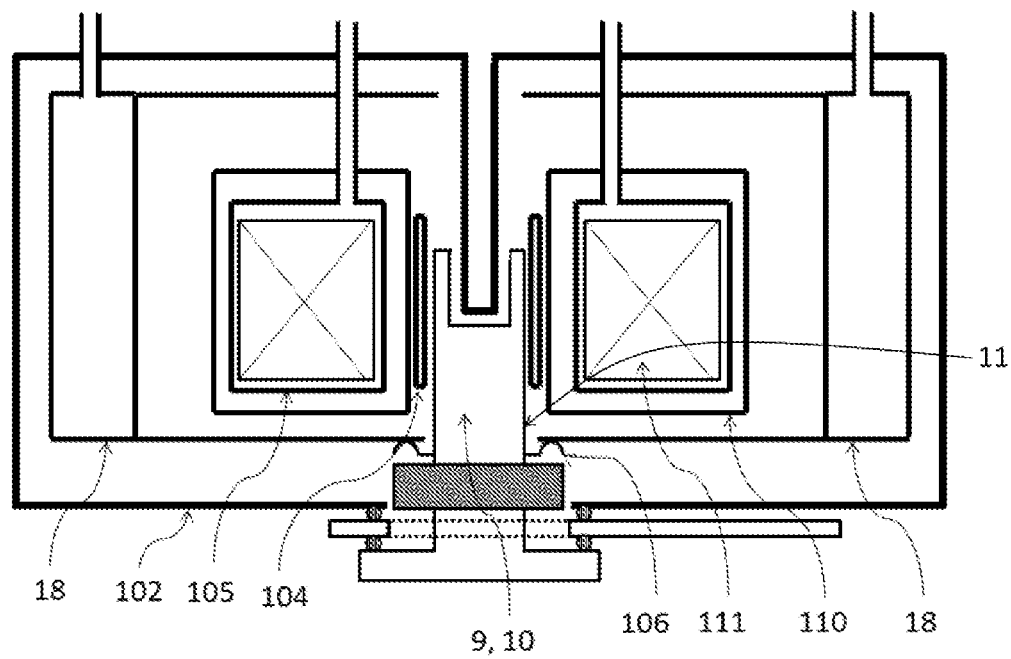
FIG. 3 is a schematic view of an example embodiment of the NMR apparatus according to the invention in the operating state, when the lock chamber is detached, also showing a helium vessel, a radiation shield, and a nitrogen vessel.

FIG. 3 shows an example of the superconducting magnet assembly 27 comprising a helium vessel 105, radiation shield 110 and nitrogen vessel 18. The nitrogen vessel 18 is thermally coupled to the NMR probe 11 comprising the cooled probe components 9, 10. This enables the nitrogen vessel 18 to cool the cooled probe components 9, 10. The radiation shield 110 may be cooled by residual enthalpy of the cryogenic helium gas flowing from the helium vessel 105, and is at an equilibrium temperature that is between the temperature of the helium vessel 105 and that of the nitrogen vessel 18.

Figure 4:
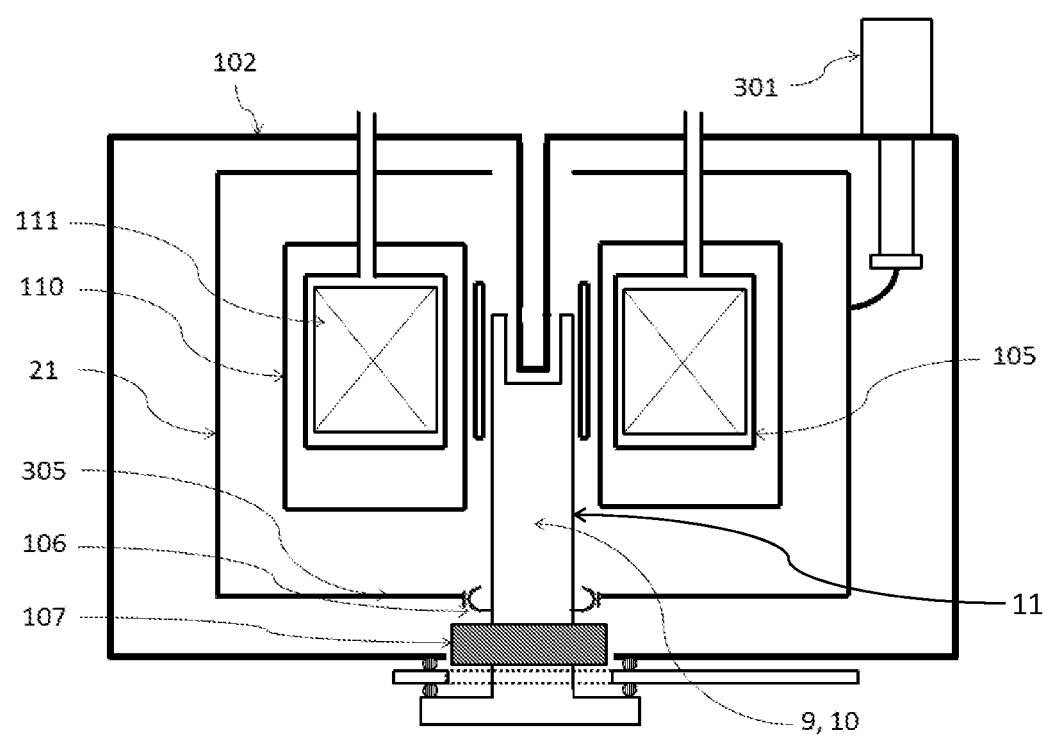
FIG. 4 is a schematic view of an example embodiment of the NMR apparatus according to the invention in the operating state, when the lock chamber is detached, also showing a helium vessel, two radiation shields, and a single-stage cryocooler.

FIG. 4 shows an embodiment comprising a single-stage cryocooler 301 instead of a nitrogen vessel 18. The cryocooler 301 cools a further radiation shield 21 that surrounds the radiation shield 110. The radiation shield 21 is in this case typically at a temperature of between 30 and 90 Kelvin. As in the case described with respect to FIG. 3, the radiation shield 110 may be cooled by residual enthalpy of the cryogenic helium gas flowing from the helium vessel 105, and is at an equilibrium temperature that is between the temperature of the helium vessel 105 and the temperature of the further radiation shield 21. The NMR probe 11 coupled to the refrigeration stage of the cryostat that is cooled by the single-stage cryocooler 301 results in the cooled probe components 9, 10 being cooled by the cryocooler 301. In this manner, the cooled probe components 9, 10 may be operated within a temperature range of between 30 and 90 Kelvin. Temperatures significantly above this temperature range would likely result in performance losses in the NMR measurements. If, on the other hand, the cooled probe components 9, 10 were to be coupled to the helium vessel 105 or the colder radiation shield 110 at a significantly lower temperature, the power dissipated in the cooled probe components 9, 10 could no longer be conducted away by the cryocooler 301. The power dissipated in the cooled probe components 9, 10 may have to be cooled by the evaporation of liquid helium from the helium vessel 105, which would lead to a significant increase in the amount of helium consumed. The example shown in FIG. 4 therefore combines low helium consumption with good NMR performance.

Figure 5:
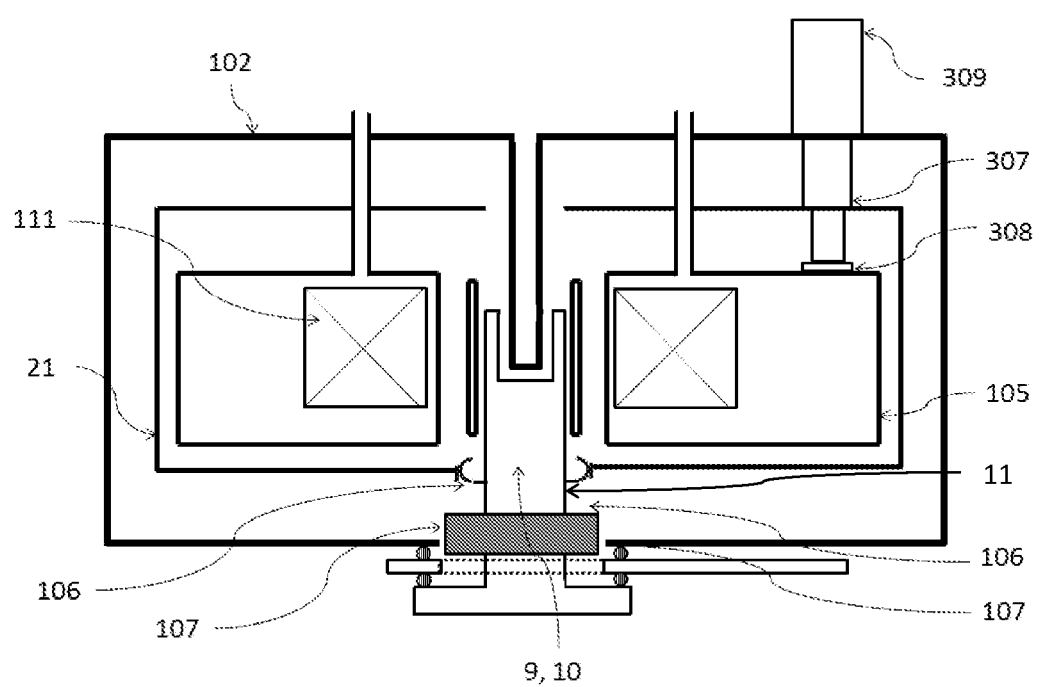
FIG. 5 is a schematic view of an example embodiment of the NMR apparatus according to the invention in the operating state, when the lock chamber is detached, also showing a two-stage cryocooler, a radiation shield, and a helium vessel.

FIG. 5 shows an embodiment comprising a two-stage cryocooler 309. Similar to the example described with respect to FIG. 4, the first stage 307 of the cryocooler 309 is coupled to the radiation shield 21, which is coupled to the cooled probe components 9, 10 via said radiation shield 21. This subsystem cooled by the first stage 307 of the cryocooler 309 operates in a similar way as the example described in FIG. 4 in terms of heat flow. In addition, however, the cryocooler 309 has a second stage 308 which provides cooling capacity at a temperature below the boiling point of helium. Through this cooling capacity, helium evaporated in the helium vessel 105 is immediately recondensed in the helium vessel 105, without leaving the helium vessel 105. A radiation shield 110 cooled by residual enthalpy of helium gas flowing from the helium vessel 105, as shown in FIG. 4, is omitted in this example. This example combines the good NMR performance of the embodiment according to FIG. 4 with a virtually unlimited helium hold time.

Figure 6:
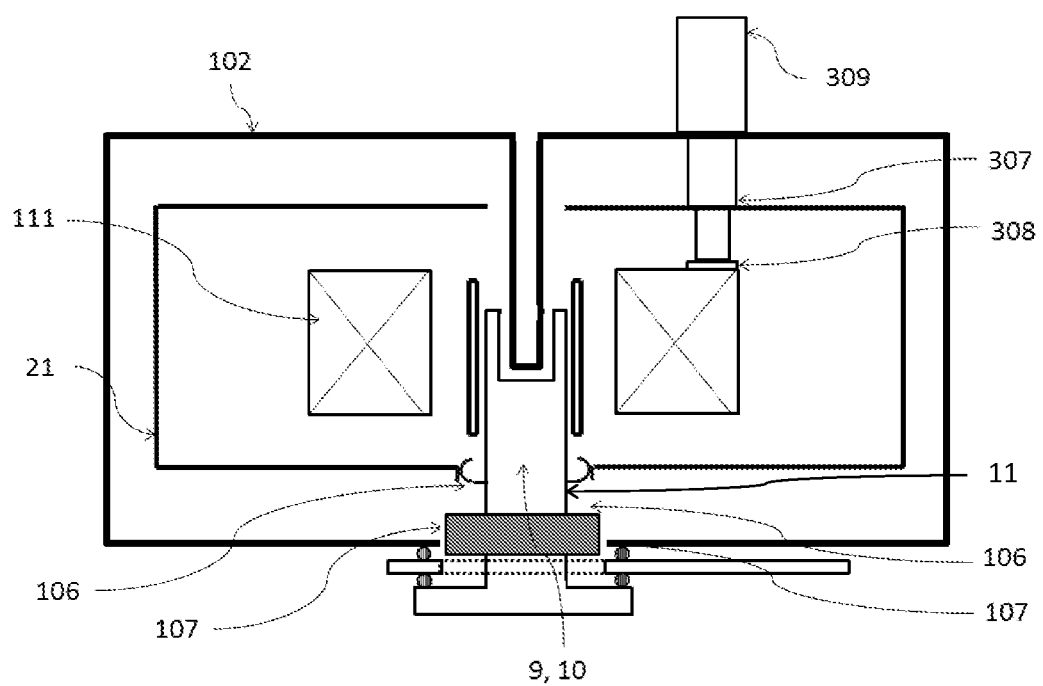
FIG. 6 is a schematic view of an example embodiment of the NMR apparatus according to the invention in the operating state, when the lock chamber is detached, also showing a two-stage cryocooler, a radiation shield, and a cryogen-free magnet.

FIG. 6 shows a further example of the assembly from FIG. 5. The thermal design is identical, but the magnet 111 is no longer housed in a helium vessel 105. The magnet 111 is thermally coupled to the second stage 308 of the cryocooler 309 using solid structures (e.g. made of copper). Since, in this case, there is neither helium nor nitrogen in the system, this example is a cryogen-free embodiment. The use of a two-stage cryocooler 309 makes it possible to use cost-effective niobium-based low-temperature superconductors or MgB2 owing to the typically very low base temperature of the second stage 308, typically in the range of single-digit Kelvin values.

Figure 7:
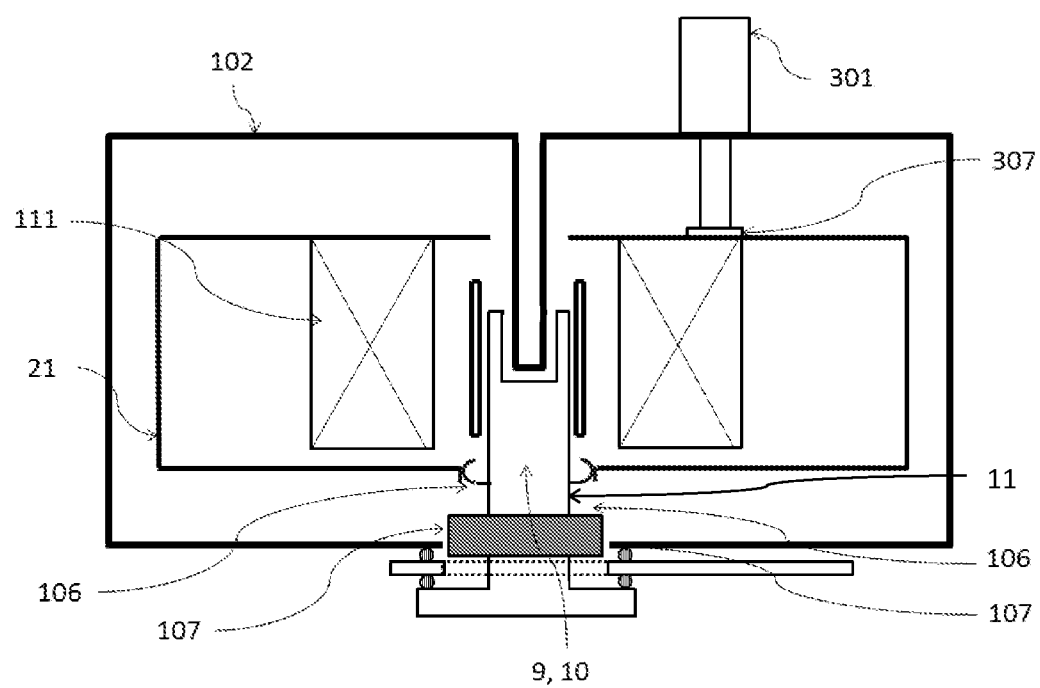
FIG. 7 is a schematic view of an example embodiment of the NMR apparatus according to the invention in the operating state, when the lock chamber is detached, also showing a single-stage cryocooler, a radiation shield, and a cryogen-free superconducting magnet coil system that is based on high-temperature superconductors.

FIG. 7 shows an example which is based on a single-stage cryocooler 301. The first (and only) stage 307 of the cryocooler 301 is coupled to the radiation shield 21. The first stage 307 is coupled to the cooled probe components 9, 10 via the radiation shield 21, and further coupled to a cryogen-free superconducting magnet coil system 111. The operating temperatures that can typically be reached in single-stage cryocoolers (e.g., at a total thermal load from 5 to 20 Watts) are typically 40 Kelvin or higher, which restricts the superconducting magnet assembly 27 to superconducting magnet coil systems 111 based on high-temperature superconductors.

Figure 8:
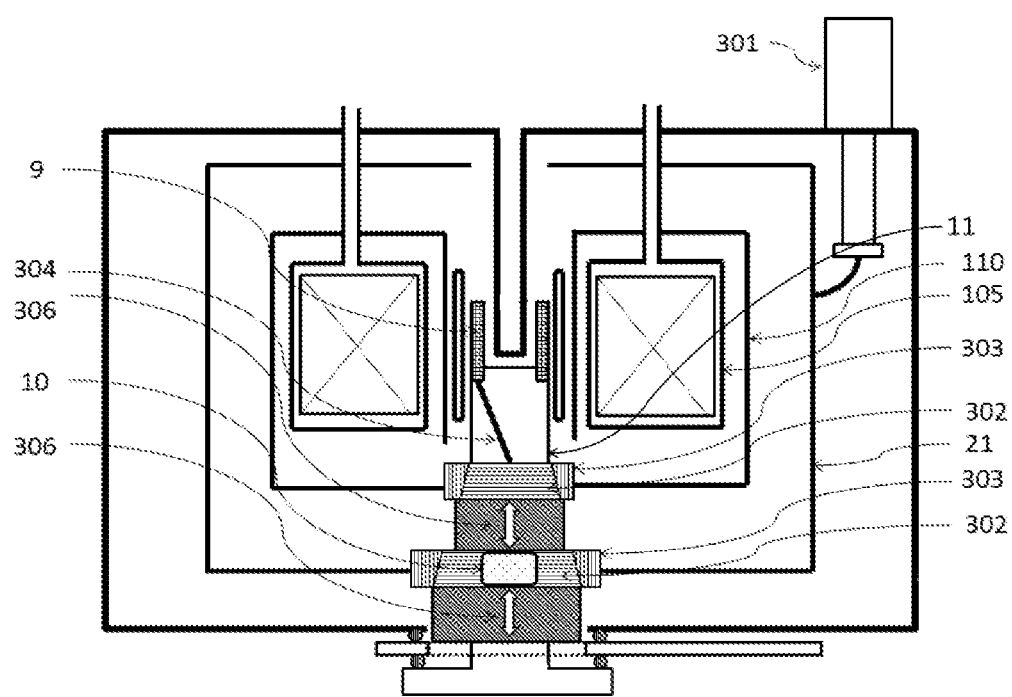
FIG. 8 is a schematic view of an example embodiment of the NMR apparatus according to the invention in the operating state, when the lock chamber is detached, also showing a helium vessel, two radiation shields, and a single-stage cryocooler, and showing the cooled probe components coupled to the radiation shields via thermal contact elements.

FIG. 8 shows an example of a releasable thermal contact 106 between the NMR probe 11 comprising the cooled probe components 9, 10, and the radiation shields 21, 110 from the example shown in FIG. 4. The thermal connection is brought about by a probe-side thermal contact element 302 and by a refrigeration-stage-side thermal contact element 303, which are typically formed as a gold-coated cone and mating cone. Each cone may be supported by a spring element 306 which ensures that there is the required contact pressure on the mating cone. This force is significantly strengthened by the specific geometry of the cone, since the axial force supplied by the spring element 306 results in a normal force on the contact surface that is increased by up to an order of magnitude. The increased normal force ultimately provides for the thermal coupling between the cone and the mating cone. The cooled probe component 9 comprises, in this embodiment, an HF coil, which is coupled to the colder radiation shield 110. The cooled probe component 10, for example an electronic amplifier component, is operated at the higher temperature of the warmer radiation shield 21.

Figure 9:
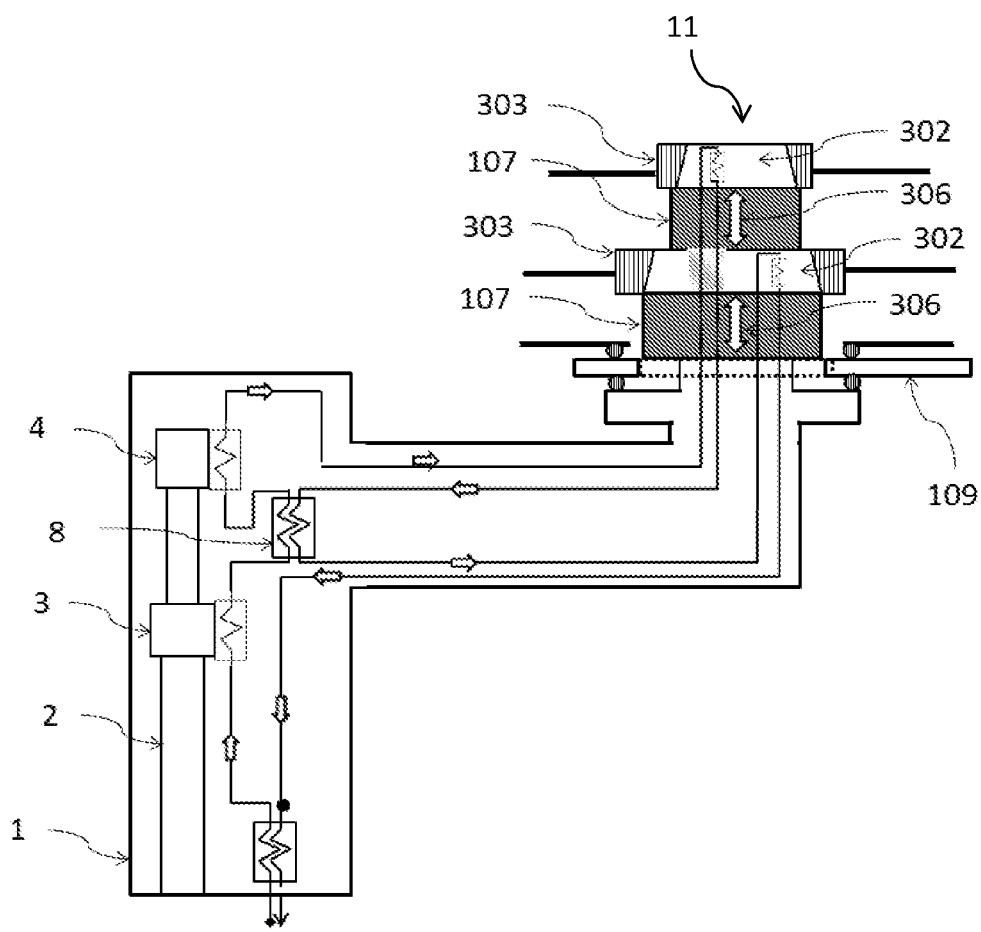
FIG. 9 is a schematic view of the thermal contact elements of FIG. 8, in which the probe-side thermal contact elements are cooled by an external coolant stream circulating from a cryocooler of the NMR probe.

FIG. 9 shows an example of the NMR apparatus in which refrigeration stages of the cryostat of a superconducting magnet assembly 27 and cooled probe components 9, 10 of an NMR probe 11 are cooled together using an external cryocooler 2 of the NMR probe 11. In this case, a coolant stream conveyed by the compressor of this cryocooler 2 flows, in succession, through a first counter flow heat exchanger, a heat exchanger on the first stage 3 of the cryocooler 2, a counter flow heat exchanger 8 and a heat exchanger on the second stage 4 of the cryocooler 2 until the coolant has cooled down to a temperature of typically close to 10 Kelvin. The coolant is then guided through a heat-insulated line to the NMR probe 11 and is coupled here to the colder probe-side thermal contact element 302 via a heat exchanger, and then flows back into the heat-insulated housing 1 of the cryocooler 2. After passing through the counter flow heat exchanger 8, the coolant flows to the heat exchanger on the warmer probe-side contact element 302, and from there flows back into the heat-insulated housing 1 and finally back to the compressor via the first counter flow heat exchanger.

The cooled probe components 9, 10 are connected to the probe-side thermal contact elements 302 in a heat-conducting manner, for example through a heat-conducting mechanical structure 304.

The example shown in FIG. 9, which includes thermally attaching the probe-side thermal contact element 302 to a cooling circuit cooled by an external cryocooler 2 of the NMR probe 11, is the reverse of the example described in FIG. 4 in terms of heat flow. In this example, the superconducting magnet assembly 27 is cooled alongside with the cooled probe components 9, 10 by the cryocooler 2 of the NMR probe 11, whereas in FIG. 4 the cooled probe components 9, 10 of the NMR probe 11 are cooled alongside with the superconducting magnet assembly 27 by the cryocooler 301 of the cryostat of the superconducting magnet assembly 27.

An assembly comprising a cryocooler 2 of the NMR probe 11 that has just one stage is also conceivable. In this case, the counter flow heat exchanger 8 and the second stage 4 of the cryocooler 2 may be omitted from the example described in FIG. 9. This results in higher temperatures on the cooled probe components 9, 10, which may lead to reduced NMR performance which may, however, be adequate in some applications.

In another example, the cooled probe components 9, 10 may be cooled by a coolant stream from the external cryocooler 2, and the refrigeration stages of the cryostat may be cooled by a cryocooler 301 of the cryostat or by the evaporation of cryogenic liquids. In this case, thermal coupling between the refrigeration stages of the cryostat and the cooled probe components 9, 10 can be dispensed with, and the thermal contact elements 302, 303 may be omitted.

LIST OF REFERENCE NUMERALS 1 heat-insulated housing
2 cryocooler of the NMR probe
3 first stage of the cryocooler 2
4 second stage of the cryocooler 2
8 counter flow exchanger
9 cooled probe component
10 cooled probe component
11 NMR probe
18 nitrogen vessel
21 radiation shield
27 superconducting magnet assembly
101 cold bore of the superconducting magnet coil system
102 vacuum vessel of the cryostat
103 room temperature access
104 shim system
105 helium vessel 106 releasable thermal contact
107 thermal insulation
108 opening in the vacuum vessel
109 lock valve
110 radiation shield
111 superconducting magnet coil system
112 lock chamber
113 pump-out valve
114 sealing ring
301 single-stage cryocooler of the cryostat
302 probe-side thermal contact element
303 thermal contact element of the refrigeration stage of the cryostat
304 heat-conducting mechanical structure
306 spring element
307 first stage of the cryocooler
308 second stage of the cryocooler
309 two-stage cryocooler of the cryostat

What is claimed is:

1. A Nuclear Magnetic Resonance (NMR) apparatus comprising:
a superconducting magnet assembly comprising:
a cryostat with a vacuum vessel and a refrigeration stage at an operating temperature of <100 K, wherein the vacuum vessel includes an opening operable to be closed with a lock valve, and a lock chamber which is directly connected to the opening or a device for attaching the lock chamber to the opening such that the lock chamber and the opening are directly connected; and
a superconducting magnet coil system with a cold bore into which a room temperature access of the cryostat engages; and
an NMR probe including probe components cooled to an operating temperature of <100 K, wherein the cooled probe components are arranged, at least in part, in a region between the cold bore of the superconducting magnet coil system and the room temperature access of the cryostat into the cold bore, radially inside the cold bore and outside the room temperature access of the cryostat,
wherein the opening and the lock valve are sized and arranged such that the cooled probe components are installed and/or removed through the opening and the lock valve.

2. The NMR apparatus according to claim 1, wherein the cooled probe components arranged in the region between the cold bore of the superconducting magnet coil system and the room temperature access of the cryostat into the cold bore include a high frequency (HF) coil.

3. The NMR apparatus according to claim 1, further comprising a mechanically releasable thermal contact between the cooled probe components and the refrigeration stage of the cryostat.

4. The NMR apparatus according to claim 3, wherein the refrigeration stage comprises a nitrogen vessel, and wherein the cooled probe components are coupled through the mechanically releasable thermal contact to the nitrogen vessel.

5. The NMR apparatus according to claim 3, wherein the refrigeration stage comprises a radiation shield, which is cooled by a single-stage cryocooler, and wherein the cooled probe components are coupled through the mechanically releasable thermal contact to the radiation shield cooled by the single-stage cryocooler.

6. The NMR apparatus according to claim 3, wherein the refrigeration stage comprises a radiation shield which is cooled by a first stage of a two-stage cryocooler, and wherein the cooled probe components are coupled through the mechanically releasable thermal contact to the radiation shield cooled by the first stage of the two-stage cryocooler.

7. The NMR apparatus according to claim 3, wherein the superconducting magnet coil system is cooled by a single-stage cryocooler, and wherein the cooled probe components are coupled through the mechanically releasable thermal contact to the superconducting magnet coil system cooled by the single-stage cryocooler.

8. The NMR apparatus according to claim 3, wherein the mechanically releasable thermal contact comprises a first thermal contact element formed as a cone and a second thermal contact element formed as an interlocking mating cone, the cone and the interlocking mating cone being produced from a heat-conductive material having a heat conductivity of greater than 20 W/(K*m) at the operating temperature, wherein the cone and the interlocking mating cone are coated with a noble metal, and wherein the cone and the interlocking mating cone are pressed against one another by a spring element with a force of at least 20 N.

9. The NMR apparatus according to claim 8, wherein the heat-conductive material comprises copper, and wherein the noble metal comprises gold.

10. The NMR apparatus according to claim 1, wherein the cooled probe components are cooled from outside the cryostat with an external cooling circuit.

11. The NMR apparatus according to claim 1, wherein the cooled probe components include normally conducting or superconducting components.

12. The NMR apparatus according to claim 3, wherein the mechanically releasable thermal contact comprises a probe-side thermal contact element and a refrigeration-stage-side thermal contact element, the probe-side thermal contact element being colder than the refrigeration-stage-side thermal contact element.

13. The NMR apparatus according to claim 1, wherein the NMR probe is designed such that, in an installed state, a part of the NMR probe closes the lock valve in the opening of the vacuum vessel in an air-tight manner, enabling the lock chamber to be detached.

14. The NMR apparatus according to claim 1, wherein the superconducting magnet coil system comprises low temperature superconducting (LTS) elements or high temperature superconducting (HTS) elements.

15. The NMR apparatus according to claim 1, wherein the superconducting magnet assembly includes a shim system, and wherein the shim system includes an active shim system comprising shim coils, or a passive shim system comprising one or more ferromagnetic field-shaping elements, and wherein the shim system is arranged inside the cryostat in order to homogenize a magnetic field, and wherein the shim system is arranged between the cold bore of the superconducting magnet coil system and the cooled probe components, and wherein the shim system is thermally attached to the refrigeration stage of the cryostat or to an external cooling circuit.

16. A method for installing and removing probe components in/from the vacuum vessel of the cryostat of the superconducting magnet assembly of the NMR apparatus according to claim 13, the method comprising:
decoupling connection lines of the NMR probe to other parts of the NMR apparatus;
attaching the lock chamber to the lock valve;
evacuating the lock chamber;

moving probe components to be removed out of the vacuum vessel of the cryostat and into the lock chamber;

closing the lock valve;

flooding and opening the lock chamber, and taking out the probe components to be removed;

introducing probe components to be installed into the lock chamber, and closing and evacuating the lock chamber;

opening the lock valve;

moving the probe components to be installed out of the lock chamber and into the vacuum vessel of the cryostat;

flooding and removing the lock chamber; and coupling connections of an external cooling circuit to the NMR probe.

* * * * *